US010224402B2

(12) United States Patent
Lavrovskaya et al.

(10) Patent No.: US 10,224,402 B2
(45) Date of Patent: Mar. 5, 2019

(54) METHOD OF IMPROVING LATERAL BJT CHARACTERISTICS IN BCD TECHNOLOGY

(71) Applicant: Texas Instruments Incorporated, Dallas, TX (US)

(72) Inventors: Natalia Lavrovskaya, Sunnyvale, CA (US); Alexei Sadovnikov, Sunnyvale, CA (US)

(73) Assignee: TEXAS INSTRUMENTS INCORPORATED, Dallas, TX (US)

(*) Notice: Subject to any disclaimer, the term of this patent is extended or adjusted under 35 U.S.C. 154(b) by 0 days.

(21) Appl. No.: 14/540,105

(22) Filed: Nov. 13, 2014

(65) Prior Publication Data

US 2016/0141363 A1 May 19, 2016

(51) Int. Cl.
| | |
|---|---|
| *H01L 29/08* | (2006.01) |
| *H01L 27/06* | (2006.01) |
| *H01L 29/66* | (2006.01) |
| *H01L 29/735* | (2006.01) |
| *H01L 29/732* | (2006.01) |
| *H01L 29/06* | (2006.01) |
| *H01L 21/8249* | (2006.01) |

(52) U.S. Cl.
CPC ...... *H01L 29/0821* (2013.01); *H01L 21/8249* (2013.01); *H01L 27/0623* (2013.01); *H01L 29/0692* (2013.01); *H01L 29/6625* (2013.01); *H01L 29/66272* (2013.01); *H01L 29/732* (2013.01); *H01L 29/735* (2013.01)

(58) Field of Classification Search
CPC ... H01L 29/70; H01L 29/735; H01L 29/6625; H01L 27/0623; H01L 21/8222; H01L 21/8248; H01L 21/8249; H01L 27/0259; H01L 27/0635; H01L 27/1801; H01L 27/11896; H01L 27/14681; H01L 29/04; H01L 29/0804; H01L 29/0821; H01L 29/36; H01L 29/41708; H01L 29/42304; H01L 29/66234

See application file for complete search history.

(56) References Cited

U.S. PATENT DOCUMENTS

| | | | |
|---|---|---|---|
| 4,283,326 A | 8/1981 | Charles et al. | |
| 4,510,676 A | 4/1985 | Anantha et al. | |
| 5,311,054 A | 5/1994 | DeJong et al. | |
| 5,828,124 A * | 10/1998 | Villa | H01L 29/1004 257/557 |
| 6,034,413 A * | 3/2000 | Hastings | H01L 27/0623 257/197 |
| 7,285,830 B2 | 10/2007 | Chatterjee | |
| 2003/0062539 A1* | 4/2003 | Chatterjee | H01L 21/8222 257/199 |
| 2008/0017895 A1* | 1/2008 | Fallica | H01L 21/84 257/273 |

(Continued)

OTHER PUBLICATIONS

International Search Report in corresponding PCT Patent Application No. PCT/US2015/060752, dated Feb. 4, 2016 (2 pages).

*Primary Examiner* — Brigitte Paterson
(74) *Attorney, Agent, or Firm* — Jacqueline J. Garner; Charles A. Brill; Frank D. Cimino

(57) ABSTRACT

In a lateral BJT formed using a BiCMOS process, the collector-to-emitter breakdown voltage ($BV_{CEO}$) and BJT's gain, are improved by forming a graded collector contact region with lower doping levels toward the base contact.

16 Claims, 3 Drawing Sheets

(56) References Cited

U.S. PATENT DOCUMENTS

| | | |
|---|---|---|
| 2013/0075741 A1 | 3/2013 | Mallikarjunaswamy et al. |
| 2015/0008492 A1* | 1/2015 | Koike ............... H01L 21/26506 257/288 |
| 2015/0236009 A1* | 8/2015 | Gill .................... H01L 27/0259 257/491 |
| 2015/0243770 A1* | 8/2015 | Hebert ................. H01L 29/732 257/586 |

* cited by examiner

US 10,224,402 B2

METHOD OF IMPROVING LATERAL BJT CHARACTERISTICS IN BCD TECHNOLOGY

FIELD OF THE INVENTION

The invention relates to the fabrication of semiconductor devices. In particular it relates to BiCMOS devices and improving lateral BJT characteristics.

BACKGROUND OF THE INVENTION

Integrated circuits having bipolar and MOS transistors formed on the same semiconductor substrate have many applications in the electronics industry and are therefore in great demand. They combine the high power and fast switching speeds of bipolar devices with the high density and low power consumption of MOS transistors.

When forming devices using a bipolar complementary metal oxide semiconductor (BiCMOS) manufacturing process, care is taken to minimize the number of masks employed therein to lower the manufacturing costs. Therefore efforts are made as often as is practicable to integrate the use of regions typically utilized for CMOS/DMOS devices as regions in a bipolar device, and vice-versa. In BCD (Bipolar-CMOS-DMOS) technology, bipolar devices are therefore usually "mask-free" since they do not make use of dedicated masks for the base, emitter, and collector, but make use of existing process layers. While such integration does serve to minimize manufacturing costs, in some cases the integration causes performance tradeoffs to be made.

For example, prior art FIG. 1 illustrates an NPN type bipolar transistor 10 fabricated using a BiCMOS type fabrication process. The transistor 10 has an n-buried layer (NBL) 12 that is formed in a lightly doped P-type substrate 14. A P-type epitaxial (Pepi) layer 16 is then grown over the NBL 12 and the substrate 14. A deep N+ ring 18 is formed by performing either an N-type implant or N-type thermal deposition in the epitaxial layer 16. The deep N+ ring 18 extends down to the NBL 12 to couple with the NBL 12 and define a collector region. The deep N+ ring 18 also defines therein an isolated base region 22 comprising the Pepi. The N+ region 18 is usually configured as a ring to provide isolation and serve as a plug extending down to the NBL region 12 for purposes of making contact thereto. A P-type source/drain implant is then performed to define a base contact region 24 and an N-type source/drain implant is performed to form an emitter region 26, wherein the base contact region is formed concurrently with the formation of PMOS source/drain regions elsewhere, and the emitter region is formed concurrently with NMOS source/drain regions elsewhere, respectively.

The NPN bipolar transistor 10 of prior art FIG. 1 may be employed in various types of applications, and in some applications the collector-to-emitter breakdown voltage ($BV_{CEO}$) of the transistor 10 may be an issue.

Another consideration in bipolar transistor is its gain, which is sometimes referred to as the transistor β or $H_{FE}$. When using the BiCMOS process described above, the spacing between the N-type source/drain region 26 which forms the emitter and the deep N+ ring 18, which forms the collector of the lateral NPN Bipolar transistor, is quite large, which contributes to poor bipolar transistor gain.

Therefore, there is a need in the art for a CMOS/DMOS manufacturing process that allows for optimization of bipolar transistor parameters, including parameters related to horizontal bipolar transistors, without significantly increasing the number of steps and/or masks required in the process.

FIG. 2 shows another prior art BiCMOS structure that defines a medium voltage NPN device. The emitter of the NPN bipolar transistor is defined by an n-type source-drain region (NSD) region 210. The base is formed by the p-epitaxial region (Pepi) 212 and a p-buried layer (PBLMV) 214. An n-buried layer (NBL) 216 with its DEEPN 218 formed in a deep trench region providing contact to the NBL 216 defines the collector of a vertical NPN transistor, while the shallow n-well (SNW) 222 with its n-type source-drain (NSD) contact region 224 defines the collector of a lateral NPN transistor. Current flows from emitter to collector both in vertical (NSD-PBLMV-NBL) and lateral (NSD-Pepi-SNW) directions, but lateral current prevails for typical device dimensions.

$BV_{CEO}$ of this device is limited by Pepi-SNW or Pepi-DEEPN junction breakdown and is often not high enough for device operation.

SUMMARY OF THE INVENTION

The present disclosure seeks to improve lateral BJT characteristics in a BCD process by making use of a graded collector contact. For purposes of this disclosure, the term graded refers to the grading of the doping profile.

According to the invention, there is provided a lateral bipolar junction transistor (BJT) in which the collector includes a graded collector contact. The graded collector contact comprises a deep well (DWELL). The DWELL may be provided with a graded profile by subjecting it to very high thermo-cycle. The collector may also include a collector contact moat, which may comprise a shallow well (SWELL). The lateral BJT may be part of a BCD process wherein an emitter of the BJT is defined by a source-drain region (SD), and a base is defined by an epitaxial region (epi) with a second source-drain region (SD) of opposite polarity to the SD of the emitter, forming a contact to the base. The base may further include a shallow well (SW) in which the base contact SD is formed. The DWELL may be configured to extend toward the base contact SD, with lower doping level closer to the base contact SD. The doping level of the DWELL may be lower than that of the SWELL. Both DWELL and SWELL may be formed by ion implantation. The SWELL is typically formed after the DWELL and, hence, does not see high thermo-cycle. Typically the SWELL and DWELL may be configured so that the SWELL is at least partially surrounded by the DWELL.

Further, according to the invention, there is provided a method of improving lateral BJT characteristics, comprising providing a graded collector contact. The graded collector contact may be defined by a deep well (DWELL). The graded DWELL may be achieved by high-energy, e.g., approximately 1 MeV phosphorous implant followed by a long anneal, e.g., 75 minutes at 1150 C. A lower doped portion of the graded collector contact may extend toward a base contact of the BJT. The method may include providing the collector contact with a shallow well (SWELL) moat of same doping type as the DWELL. The SWELL may be formed in the DWELL. The SWELL may make contact with a source-drain region (SD) that defines a collector surface contact of same doping type as the DWELL and SWELL. The SWELL may also make contact with a DEEP region (formed in a deep trench region that serves as contact for a buried layer, both the DEEP region and the buried layer having the same doping type as the DWELL and SWELL.

DETAILED DESCRIPTION OF THE INVENTION

Figure 3:
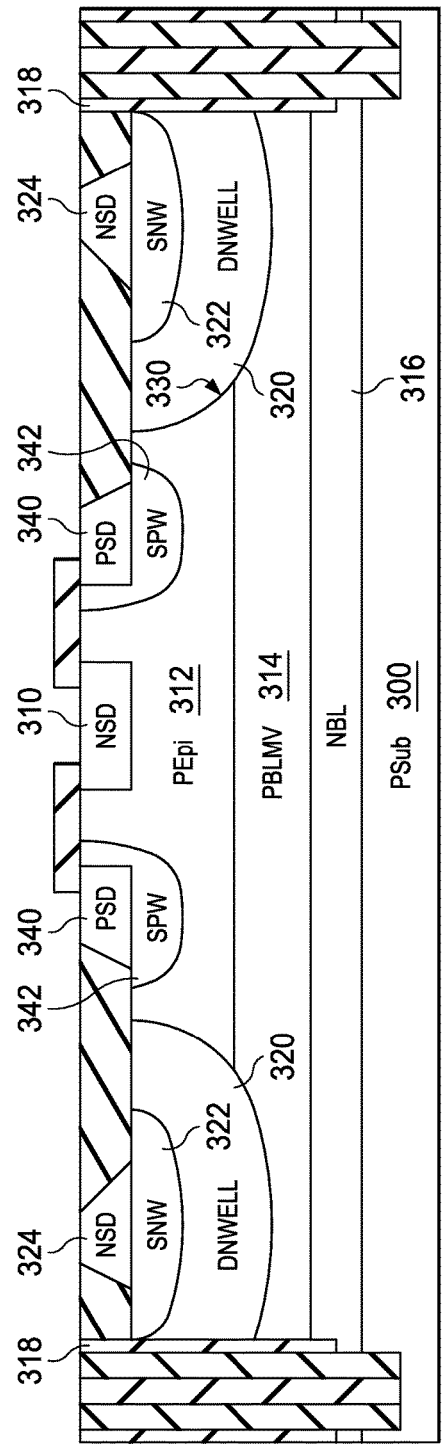
FIG. 3 is sectional view through one embodiment of a BiCMOS structure of the invention.
Figure 4:
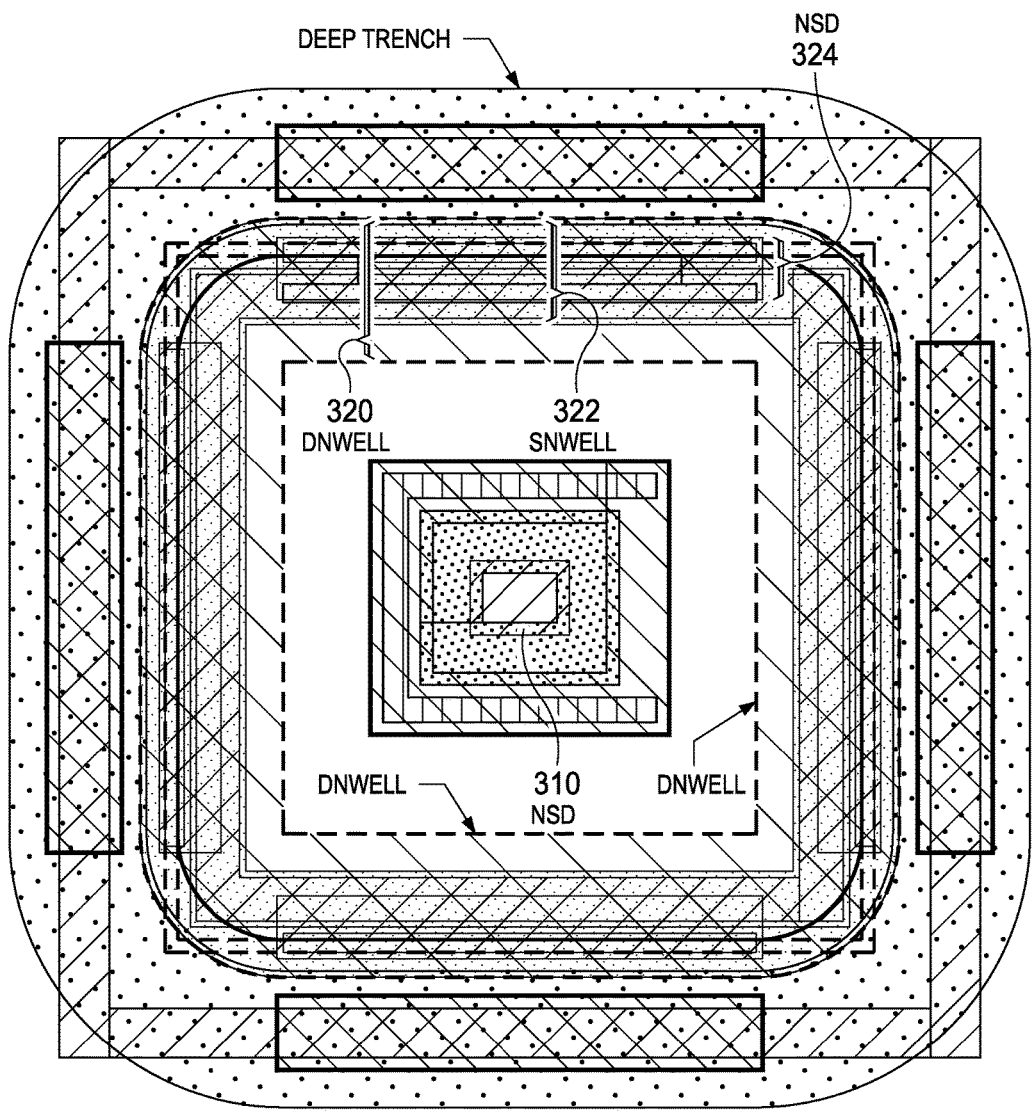
FIG. 4 is a top view of the BiCMOS structure of FIG. 3.

One embodiment of the invention is shown in FIGS. 3 and 4, which show a BiCMOS structure defining a vertical and a lateral NPN bipolar junction transistor (BJT). It will, however, be appreciated that the invention can also be implemented to define a lateral PNP, by using the opposite polarities of the various doped regions.

As shown in the sectional side view of FIG. 3, the structure is formed on a p-substrate (PSub) 300. The emitter of both the vertical and lateral NPN bipolar transistor is defined by an n-type source-drain region (NSD) region 310. The base is formed by the p-epitaxial region (Pepi) 312 and a p-buried layer (PBLMV) 314. In the case of the lateral BJT contact to the Pepi 312 defining the base, is achieved by means of the p-type source-drain (PSD) region 340 via the shallow p-well (SPW) 342. An n-buried layer (NBL) 316 defines the collector of a vertical NPN transistor, a DEEPN region 318, formed in a Deep Trench, providing contact to the NBL 316.

In this embodiment, the lateral NPN BJT collector is defined by a graded deep n-type well (DNWELL) 320 and a shallow n-type well (SNWELL) 322. The SNWELL forms a collector contact moat and makes contact with an n-type source-drain (NSD) region 324. By subjecting the DWELL (in this case DNWELL 320) to very high thermo-cycle, e.g., 75 minutes at 1150 degrees C., it is provided with a graded profile. The DNWELL may be configured to extend toward the PSD 340 defining the base contact, with lower doping level closer to the PSD 340. The doping level of the DWELL in this embodiment is chosen to be lower than that of the SNWELL. Both the DNWELL and SNWELL are formed by ion implantation. The SNWELL is formed after the DNWELL and, hence, unlike the DNWELL, does not see high thermo-cycle but is annealed at typical lower temperatures and shorter times such as 30 minutes at 900 degrees C. While the present embodiment shows the DNWELL 320 having a vertical dimension that allows it to extend into the PBLMV 314, whereas the SNWELL 322 does not extend deeper than the Pepi 312, these dimensions may vary. The important aspect is the doping profile in a lateral direction, and ensuring that the DNWELL 320 has a lower doping profile than the SNWELL 322 and extends further laterally toward the PSD 340 than the SNWELL 322.

Figure 1:
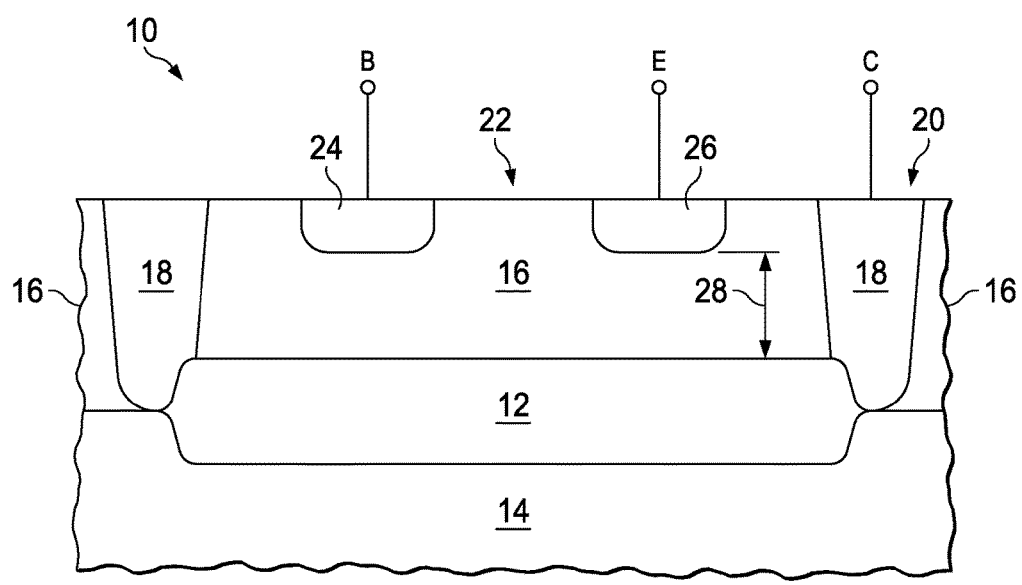
FIG. 1 is a sectional side view through a prior art BiCMOS structure.
Figure 2:
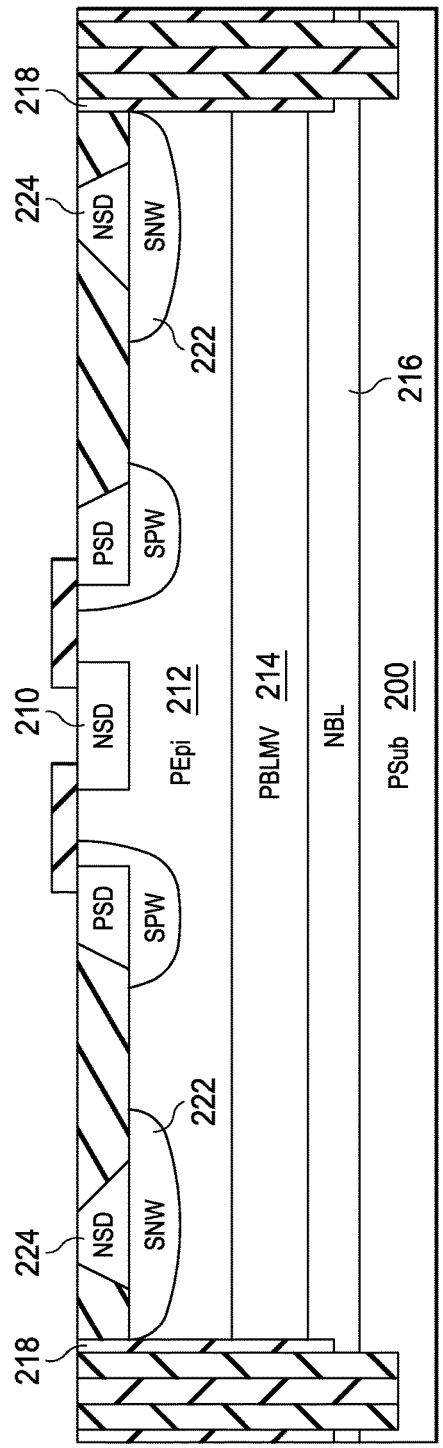
FIG. 2 is a sectional side view through another prior art BiCMOS structure.

As in the prior art structure discussed above with respect to FIG. 2, current flows from emitter to collector both in vertical (NSD-PBLMV-NBL) and lateral (NSD-Pepi-SNW) directions. However, in the structure of the present invention, the profile of the lateral collector contact is graded in a lateral direction with doping levels getting lower toward the PSD 340 and the NSD emitter contact 310. This has the effect of reducing the electric field at the Pepi junction 330. Also, since the lateral base width is reduced by the addition of the DNWELL 320, the gain $\beta$ or $H_{FE}$ is increased. The VA is also increased due to lower collector-base junction capacitance. Thus, by adding a collector contact with a graded profile (DNWELL in this embodiment) to the collector contact moat it creates a graded collector contact, which increases the device operating temperature and improves the $\beta$*VA product.

20 V Vertical NPN for MV Flow

TABLE 1

| 20 V Vertical NPN for MV flow | | |
|---|---|---|
| Parameter | Prior Art Device | Device with graded collector contact |
| $\beta$ or $H_{FE}$, low Jc | 54 | 74 |
| $\beta$ or $H_{FE}$, medium Jc | 49 | 65 |
| $\beta$ or $H_{FE}$, high Jc | 33 | 41 |
| Va (Volts) | 400 | 500 |
| Vbe | 0.655 | 0.648 |
| BVceo | 17.8 | 27.5 |

Table 1 shows the significant increase in the gain $\beta$ ($H_{FE}$) at different current densities, and the collector-to-emitter breakdown voltage ($BV_{CEO}$) for NPN device with a graded collector contact in accordance with the invention, as opposed to a prior art device. Low Jc=1 e-7 A/$\mu$m$^2$; medium Jc=1 e-6 A/$\mu$m$^2$; high Jc=1 e-5 A/$\mu$m$^2$. If a curve is plotted of output voltage Vce against collector current Ic for some forward bias of the emitter and two reverse voltages on the collector, Va is the intercept on the Vce axis extrapolated to Ic=0

In the above embodiment the DNWELL is formed by using high-energy (approximately 1 MeV) phosphorous implant and subsequently a long anneal cycle (approximately 75 minutes at 1150 degrees C.). First the DNWELL is implanted, whereafter the SNWELL is implanted. In this embodiment the maximum DNWELL concentration is ~1 e16/cm$^3$, going down to 1 e15/cm$^3$ over a distance of about 2.5 $\mu$m, while the maximum SNWELL concentration is ~2 e17/cm$^3$. It will be appreciated that the maximum doping concentration of the PWELL and SWELL will depend on the voltage rating of the BJT.

A top view of the structure of FIG. 3 is shown in FIG. 4, which shows the ring-like configuration of the collector structure (DNWELL 320, SNWELL 322, NSD 224) and the DEEPN 318.

It will be appreciated that the graded collector contact can be implemented in different ways to the deep well described in the above embodiment.

What is claimed is:

1. A bipolar junction transistor (BJT), comprising:
an emitter;
a base including a base contact region and a buried base layer positioned under the base contact region; and
a collector including a graded collector contact region extending toward the base contact region, the graded collector contact region having a lateral doping concentration that drops toward the base contact region, and the collector laterally surrounding the emitter and the base, wherein the graded collector contact region comprises a deep well and a shallow well located within the deep well and the deep well is more lightly doped than the shallow well, the graded collector contact region including a deep trench extending vertically to contact the shallow well and the deep well;

wherein the buried base layer extends under the graded collector contact region.

2. The BJT of claim 1, wherein the base includes an epitaxial layer positioned above the buried base layer.

3. The BJT of claim 2, wherein the base contact region includes a shallow well positioned above the epitaxial layer.

4. The BJT of claim 1, wherein the deep well of the graded collector contact region includes an n-type deep well and the shallow well of the graded collector contact region is an n-type shallow well positioned within and above the n-type deep well.

5. The BJT of claim 1, wherein the deep well of the graded collector contact region includes a p-type deep well and the shallow well of the graded collector contact region is a p-type shallow well positioned within and above the p-type deep well.

6. A bipolar junction transistor (BJT), comprising:
an emitter;
a base including a first buried layer, an epitaxial layer positioned above the first buried layer, and a base contact region formed in the epitaxial layer; and
a collector laterally surrounding the emitter and the base, the collector including:
a second buried layer extending under the first buried layer; and
a graded collector contact region coupled to the second buried layer and abutting the epitaxial layer and partially penetrating the first buried layer, wherein the graded collector contact region includes a p-type deep well and a p-type shallow well positioned within and above the p-type deep well.

7. The BJT of claim 6, wherein the graded collector contact region includes the p-type deep well extending below the epitaxial layer of the base.

8. The BJT of claim 6, wherein the first buried layer includes a p-type buried layer and the second buried layer includes an n-type buried layer.

9. The BJT of claim 6, wherein the base contact region includes a shallow well positioned above the epitaxial layer.

10. The BJT of claim 6, wherein the graded collector contact region includes:
a deep trench extending vertically to couple the p-type shallow well and the p-type deep well to the second buried layer.

11. The BJT of claim 6, wherein the graded collector contact region includes:
the p-type shallow well having a first doping level; and
the p-type deep well having a second doping level lower than the first doping level.

12. The BJT of claim 11, wherein the first doping level is higher than $1e16/cm^3$ and the second doping level ranges from $1e16/cm^3$ to $1e15/cm^3$.

13. A bipolar junction transistor (BJT), comprising:
an emitter;
a base including a first buried layer, an epitaxial layer positioned above the first buried layer, and a base contact region formed in the epitaxial layer; and
a collector laterally surrounding the emitter and the base, the collector including:
a second buried layer positioned below the first buried layer; and
a graded collector contact region coupled to the second buried layer and abutting the epitaxial layer and partially penetrating the first buried layer, wherein the graded collector contact region extends toward the base contact region and has a doping concentration that drops from $1\,e16/cm^3$ to $1\,e15/cm^3$ over a distance of 2.5 μm towards the base contact region.

14. The BJT of claim 13, wherein the graded collector contact region includes a shallow well positioned within a deep well.

15. The BJT of claim 13, wherein the graded collector contact region includes:
a shallow well;
a deep well positioned below and partially surrounding the shallow well; and
a deep trench extending vertically to couple the shallow well and the deep well to the second buried layer.

16. The BJT of claim 13, wherein the graded collector contact region includes:
a shallow well having a first doping level; and
a deep well positioned below and partially surrounding the shallow well, the deep well having a second doping level lower than the first doping level.

* * * * *